United States Patent
Hecht et al.

(10) Patent No.: US 7,358,187 B2
(45) Date of Patent: Apr. 15, 2008

(54) COATING PROCESS FOR PATTERNED SUBSTRATE SURFACES

(75) Inventors: Thomas Hecht, Dresden (DE); Stefan Jakschik, Dresden (DE); Uwe Schröder, Dresden (DE)

(73) Assignee: Infineon Technologies AG, Munich (DE)

( * ) Notice: Subject to any disclaimer, the term of this patent is extended or adjusted under 35 U.S.C. 154(b) by 279 days.

(21) Appl. No.: 11/147,892

(22) Filed: Jun. 8, 2005

(65) Prior Publication Data

US 2005/0277295 A1    Dec. 15, 2005

(30) Foreign Application Priority Data

Jun. 9, 2004    (DE) ...................... 10 2004 028 030

(51) Int. Cl.
*H01L 21/31*    (2006.01)
*H01L 21/44*    (2006.01)

(52) U.S. Cl. .................. 438/680; 438/763; 438/778; 257/E21.171; 257/E21.528; 257/E21.585

(58) Field of Classification Search ............... 438/680, 438/763, 778
See application file for complete search history.

(56) References Cited

U.S. PATENT DOCUMENTS

2002/0064592 A1    5/2002    Datta et al.

2003/0015764 A1    1/2003    Raaijmakers et al.

FOREIGN PATENT DOCUMENTS

| WO | WO 01/78123 | 10/2001 |
|---|---|---|
| WO | WO 03/083167 | 10/2003 |

OTHER PUBLICATIONS

Hausmann et al., "Rapid Vapor Deposition of Highly Conformal Silica Nanolaminates," *SCIENCE*, vol. 298, pp. 402-406, Oct. 11, 2002.
German Office Action dated Apr. 8, 2005.

*Primary Examiner*—Alexander Ghyka
(74) *Attorney, Agent, or Firm*—Jenkins, Wilson, Taylor & Hunt, P.A.

(57) ABSTRACT

The present invention provides a coating process for patterned substrate surfaces, in which a substrate (101) is provided, the substrate having a surface (105) which is patterned in a substrate patterning region (102) and has one or more trenches (106) that are to be filled to a predetermined filling height (205), a catalyst layer (201) is introduced into the trenches (106) that are to be filled, a reaction layer (202) is deposited catalytically in the trenches (106) that are to be filled, the catalytically deposited reaction layer (202) is densified in the trenches (106) that are to be filled, and the introduction of the catalyst layer (201) and the catalytic deposition of the reaction layer (202) are repeated until the trenches (106) that are to be filled have been filled to the predetermined filling height (205).

23 Claims, 3 Drawing Sheets

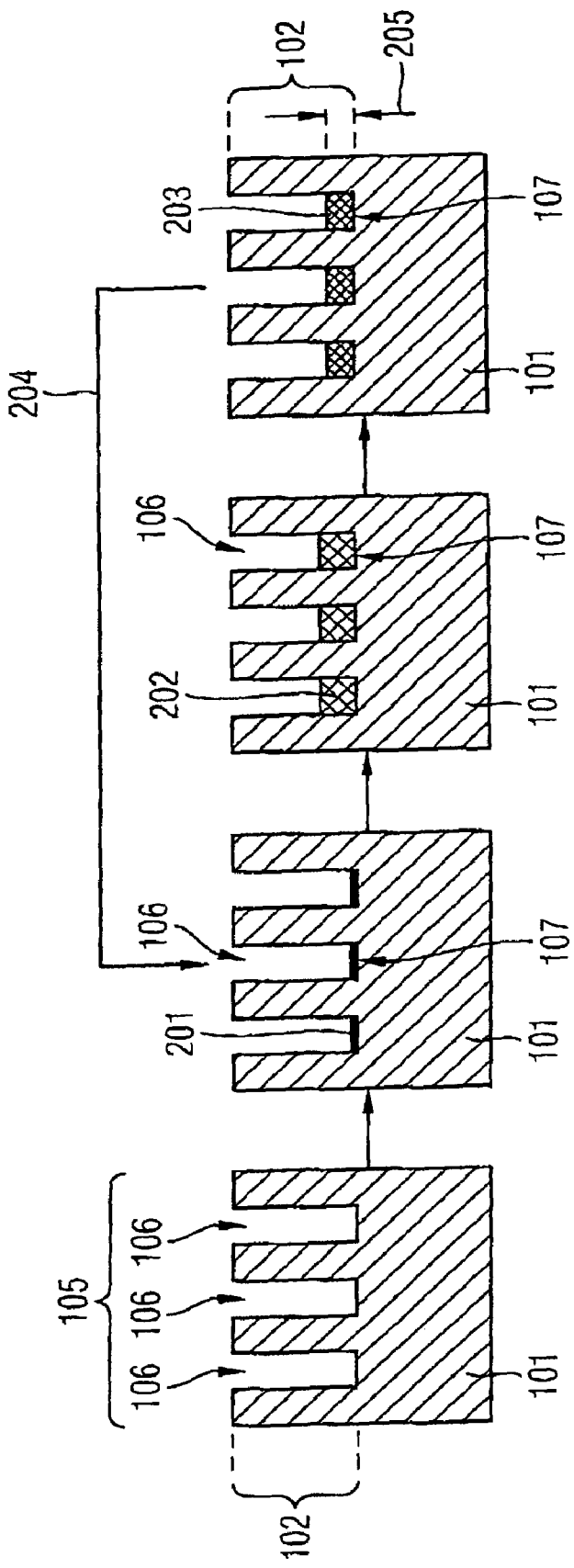

COATING PROCESS FOR PATTERNED SUBSTRATE SURFACES

TECHNICAL FIELD

The present invention relates to a coating process for patterned substrate surfaces, and relates in particular to filling processes for filling structures with a high aspect ratio.

BACKGROUND ART

Specifically, the present invention relates to coating processes for a substrate which has a surface which is patterned in a substrate patterning region and has one or more trenches that are to be filled to a predetermined filling height; there should be no mechanical stresses produced and no holes formed during the filling process.

In semiconductor manufacture, structures with a high aspect ratio often have to be filled with predetermined materials. Structures of this type include inter-wordlines, STIs, trench capacitors, film capacitors, etc. In semiconductor manufacture, fabrication processes can often be simplified by performing selective deposition of a material provided as a thin film. It is in this way possible to provide what are known as "self-aligning" integration processes. Highly uniform and conformal layers, in particular thin films, can be produced by what is known as atomic layer deposition (ALD).

Atomic layer deposition of this type usually has extremely low deposition rates, such that only layer thicknesses in the region of one nanometer (nm) can be deposited in a deposition cycle. Hausmann et al. "Rapid Vapor Deposition of Highly Conformal Silicananolaminates", Science, Volume 298, Oct. 11, 2002, pages 402-406, www.sciencemag.org have proposed a catalytic mechanism for increasing the deposition rates. Atomic coating processes of this type are important for semiconductor manufacture since it is possible to control the stoichiometry at atomic level.

The thickness of a film can be set by counting the number of reaction cycles in the usual way and is not generally subject to variations caused by a nonuniform distribution of gas or temperature in the reaction zone. Consequently, thin films with a uniform thickness distribution can easily be deposited over large areas. However, many applications in which atomic layer deposition could advantageously be employed are ruled out by the extremely low deposition rates of just a few nanometers (nm) per cycle. In the abovementioned publication by Hausmann et al., it is proposed to use catalytic deposition based on atomic layer deposition in which it is possible to achieve deposition rates of a few tens of nanometers (nm) per cycle.

Although the deposition process proposed by Hausmann et al. has achieved a deposition rate which is high for atomic coating processes, the process proposed by Hausmann et al. does not allow patterning of the layer.

FIG. 1(a), FIG. 1(b) and FIG. 1(c) illustrate conventional coating processes for patterned substrate surfaces which allow partial filling of the recesses which have been introduced into the substrate surface. FIG. 1(a) shows a substrate 101 which has a substrate patterning region 102 with a predetermined aspect ratio. The trenches designated by reference numeral 106 are to be partially filled with a material. The trenches 106 are usually designed in such a manner that their width increases in the upward direction, i.e. the structures arranged in the substrate patterning region 102 narrow slightly toward the top.

FIG. 1(b) shows the substrate 101 shown in FIG. 1(a) after a first coating step, in which a functional layer 103 has been applied to all the surfaces within the substrate patterning region 102. If atomic deposition by means of an atomic layer deposition (ALD) process is used, an extremely conformal layer deposition is achieved, and the uniform layer growth means that no holes are formed. However, it is often disadvantageous if a functional layer 103 is deposited on the side walls of the trenches 106. It may be desirable for only a base region 107 of the trenches 106 in the substrate 101 to be coated. For this purpose, as illustrated in FIG. 1(c), the raised structures are provided with a protective layer 104, in such a manner that the base region 107 of the substrate patterning region 102 remains uncovered.

Furthermore, it is possible for a protective layer 104 to be deposited on all the inner surfaces of the trench 106 and for the protective layer then to be opened up or removed in the base region 107 of the trench 106. Furthermore, the protective layer may also be deposited only on the side walls.

Conventional coating processes have the drawback that the deposition rates are extremely low. In particular the atomic layer deposition process, which can advantageously be used to avoid holes and stresses, has the drawback that only coating thicknesses in the region of a few nanometers per coating cycle can be achieved.

Therefore, it is an object of the present invention to provide a coating process for patterned substrate surfaces which allows structures with a high aspect ratio to be filled without the formation of stresses or holes.

According to the invention, this object is achieved by a process described in Patent Claim 1.

Furthermore, the object is achieved by a patterned substrate having the features of Patent Claim 25.

Further configurations of the invention will emerge from the subclaims.

A core concept of the invention consists in the trenches which have been provided in a patterned substrate surface being filled by means of a catalytically deposited reaction layer, in which case first of all a catalyst layer is introduced into the trenches that are to be filled in the substrate patterning region, then a reaction layer is deposited, and finally the reaction layer is densified and the process of introducing a catalyst layer, catalytically depositing a reaction layer and densifying it is repeated cyclically until the trenches have been filled up to a predeterminable filling height.

Therefore, an advantage of the present invention is that an atomic layer deposition process can be used to fill structures with a high aspect ratio. This opens up the possibility of filling deep trenches without stresses and without holes being formed. The process according to the invention allows a catalytic atomic layer deposition (ALD) process to be repeated cyclically such that a predetermined filling height is reached.

It is preferable to provide substrate regions or surface regions of a material on which a high deposition rate is possible.

The coating process according to the invention for patterned substrate surfaces substantially comprises the steps of:

a) providing a substrate, which has a surface which is patterned in a substrate patterning region and has one or more trenches to be filled to a predetermined filling height;

b) introducing a catalyst layer into the trenches that are to be filled in the substrate patterning region;

c) catalytically depositing a reaction layer in the trenches that are to be filled in the substrate patterning region;

d) densifying the catalytically deposited reaction layer in the trenches that are to be filled; and e) repeating steps b) to d) until the predetermined filling height of the trenches to be filled has been reached.

The subclaims give advantageous refinements and improvements to the corresponding subject matter of the invention.

According to a preferred refinement of the present invention, the step of introducing the catalyst layer into the trenches that are to be filled in the substrate patterning region is carried out by means of a physical vapor deposition operation.

According to a further preferred refinement of the present invention, the step of catalytically depositing the reaction layer in the trenches that are to be filled in the substrate patterning region is effected by the substeps of:

(i) passing a gaseous precursor over the surface of the trenches which are to be filled and have been coated with the catalyst layer, in such a manner that the precursor and the catalyst layer catalytically react with one another;

(ii) passing a gaseous coating agent over the surface of the trenches which are to be filled and have been coated with the catalyst layer, in such a manner that a reaction layer is catalytically deposited; and (iii) repeating steps (i) and (ii) above until the catalytic reactions effected by steps (i) and (ii) have ended.

According to yet another preferred refinement of the present invention, carrying out the sequence of steps (i) and (ii) described above once catalytically deposits of the reaction layer with a thickness of several nanometers (nm), preferably with a thickness of up to 100 nanometers (nm).

According to yet another preferred refinement of the present invention, the sequence of steps comprising steps (i) and (ii), which have been described above, is carried out cyclically, the number of cycles preferably being in a range between 0 and 200.

It is advantageous for the substrate to be composed of a silicon material or an insulating material. The substrate preferably has a substrate patterning region with a high aspect ratio.

According to yet another preferred refinement of the present invention, the catalytic deposition of the reaction layer in the trenches that are to be filled in the substrate patterning region comprises deposition of metal-semiconductor oxide materials, preferably of silicon oxide materials, and/or deposition of metal-semiconductor nitride materials, preferably of silicon nitride materials.

According to yet another preferred refinement of the present invention, the catalytic deposition of the reaction layer in the trenches that are to be filled in the substrate patterning region comprises deposition of a silicon dioxide thin film.

According to yet another preferred refinement of the present invention, the catalytic deposition of the reaction layer in the trenches that are to be filled in the substrate patterning region is carried out as an atomic layer deposition operation.

It is advantageous for the catalyst layer to be provided as a Lewis acid.

According to another preferred refinement of the present invention, the catalyst layer is deposited in the region of the trenches that are to be filled in the substrate patterning region at a predetermined angle with respect to the surface normal to the substrate surface.

It is advantageous for the coating process for patterned substrate surfaces to be carried out in the form of a low-pressure coating process which is carried out in a low-pressure reactor at an internal pressure in a pressure range from preferably a few mTorr to a few Torr.

According to yet another preferred refinement of the present invention, the temperature of the patterned substrate in the coating process is 50° C. to 700° C.

It is preferable for the reaction layer to be formed as a silicon dioxide layer ($SiO_2$).

According to yet another preferred refinement of the present invention, the introduction of the catalyst layer into the trenches that are to be filled in the substrate patterning region is effected by selective deposition.

It is advantageous to carry out selective deposition of the reaction layer in the trenches that are to be filled in the substrate patterning region by means of a chemical vapor deposition process (CVD=Chemical Vapor Deposition or ALD=Atomic Layer Deposition).

To fill the structures in the substrate patterning region, it may be expedient for the catalyst layer to be deposited only on base regions of the trenches that are to be filled.

According to yet another preferred refinement of the present invention, the catalytic deposition of the reaction layer in the trenches that are to be filled in the substrate patterning region is carried out by means of an anisotropic deposition process.

According to yet another preferred refinement of the present invention, the step of densifying the catalytically deposited reaction layer in the filled trenches is carried out thermally. In this context, it is preferable for the densification of the catalytically deposited reaction layer in the filled trenches to be carried out thermally in a temperature range between 500° C. and 1300° C.

According to yet another preferred refinement of the present invention, the step of densifying the catalytically deposited reaction layer in the filled trenches is carried out thermally and in a surrounding atmosphere which consists of nitrogen and/or ammonia and/or noble gases and/or oxygen-containing gases (NO, $N_2+O$, $N_2O$).

It is advantageous for the catalyst layer to be formed from a Lewis acid, e.g. one or more of the elements Al, La, Zr, Hf, Ti, B and/or In.

The reaction layer may consist of silicon dioxide ($SiO_2$) and/or silicon nitride ($Si_3N_4$). Furthermore, it is advantageous for the reaction layer to be formed from metal oxides, metal nitrides or pure metals.

The coating process according to the invention for patterned substrate surfaces makes it possible for a layer which is free of stresses and the formation of holes within the layer to be deposited in the substrate patterning region of the surface, in particular in the trenches formed in the substrate patterning region.

Exemplary embodiments of the invention are illustrated in the drawings, and explained in more detail in the description which follows.

BRIEF DESCRIPTION OF THE DRAWINGS

FIGS. 3(a) to 3(d) show a process sequence used to fill trenches in a substrate patterning region of a substrate to a predetermined filling height.

DETAILED DESCRIPTION OF THE INVENTION

In the figures, identical reference designations denote identical or functionally equivalent components or steps.

Figure 2:
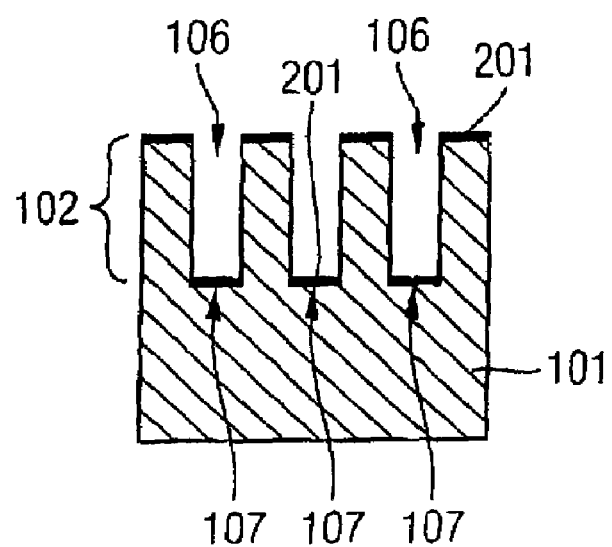
FIG. 2 shows deposition of a catalyst layer anisotropically in the base region and on the surfaces of the raised structures of a substrate patterning region.

FIG. 2 shows a substrate 101 which has a substrate patterning region 102. It should be noted that the substrate patterning region 102 is only illustrated as an example and may have structures more complex than those shown in FIG. 2. A catalyst layer 201 is deposited anisotropically only in the base region 107 of the trenches 106 of the substrate 101, in order to provide a catalytic reaction between a reaction layer that is subsequently to be applied and the catalyst layer 201 (described below with reference to FIG. 3).

FIGS. 3(a) to (d) diagrammatically depict a process sequence used to fill the trenches 106 in the substrate 101 to a filling height 205 in accordance with a preferred exemplary embodiment of the present invention.

As shown in FIG. 3(a), a substrate 101 with a predetermined substrate patterning region 102 is provided. The substrate 101 has been patterned with trenches in a surface region 105. To provide a catalytic atomic layer deposition (ALD) process, a catalyst layer 201 is deposited in the base region 107 of the trenches 106 in order to provide a catalytic reaction with a reaction layer 202 which is subsequently to be applied (FIG. 3(c)). In the state illustrated in FIG. 3(b), the catalyst layer 201 has been deposited on the base region 107 of the trenches 106 in the region of the patterned surface 105 of the substrate. A catalytic reaction is triggered, for example, by the presence of what is known as a Lewis acid. Lewis acids are materials which can accept an electron. A precursor reacts with this catalyst, with the result that a layer is deposited. The growth rates are preferably in a range from a few nanometers (nm) to a few tens of nanometers (nm) per coating cycle. The temperatures of the substrate 101 are preferably to be set in a range from 50° C. to 700° C. It is preferable to use a low-pressure coating reactor, the internal pressure of which is in a range between a few mTorr to a few Torr.

As soon as a catalytically grown layer has reached a thickness at which the catalyst has no further effect on the precursor passed over the surface, a catalytic reaction is weakened or stopped.

According to the invention, a new catalytic layer is then applied, in such a manner as to provide a repetition of process steps (arrow 204 in FIG. 3), so that a new catalyst layer 201 is deposited on the layer stack which has previously been deposited.

FIG. 3(c) shows the substrate 101 with a reaction layer 202 which has been deposited in the trenches 106 and produced by catalytic deposition. The catalytically deposited reaction layer 202 is densified in a subsequent process, illustrated in FIG. 3(d), in such a manner as to form a densified reaction layer 203. When a predetermined filling height 205 has been reached, the process stops following the step shown in FIG. 3(d). If the trenches 106 which are arranged in the substrate patterning region 102 are to be filled further, the coating procedure returns to the process step shown in FIG. 3(b), which is indicated in FIG. 3 by an arrow representing process step repetition 204. The process steps shown in FIGS. 3(b) to 3(d) are repeated until a predetermined height 205 has been reached in the trenches 106 that are to be filled.

The coating process according to the invention is preferably used to fill trenches in substrate patterning regions which have a high aspect ratio. The materials used for the catalyst layer 201 are preferably metals which represent a Lewis acid. It is preferable for the metals Al, lanthanides, Zr, Hf, Ti, B and Ni to be used as materials for the catalyst layer 201.

Materials such as silicon oxide ($SiO_2$), silicon nitride ($Si_3N_4$) and metal oxides and nitrides, as well as pure metals, are used as the reaction layer, which is preferably applied by means of an atomic layer deposition process.

For selective deposition of a catalyst layer 201 in a base region 107 of a trench 106, it is possible for a protective layer to be provided on the other surface regions of the trench 106, as has already been described with reference to FIG. 1(b) in the explanation of a conventional process. A catalyst layer 201 is not deposited on the protective layer, but the catalyst layer 201 is deposited in the base region 107 of the trenches 106. As a result of catalytic deposition of the filling material, the latter grows selectively from the base region 107 of the trenches 106. This process is continued until the trench has been filled up to a predetermined filling height 205.

It is advantageous for the catalyst layer 201 to be deposited in targeted fashion on the base region 107 of the trenches 106. The following technological processes are suitable for this purpose:

(i) sputtering of a Lewis acid;
(ii) physical vapor deposition of a Lewis acid;
(iii) diffusion of a catalyst or a catalyst layer 201 by means of a thermal process from the base region 107 of the trenches 106 to the surface, for example by using the element boron in a silicon oxide material ($SiO_2$) material;
(iv) plasma deposition of a Lewis acid; and
(v) CVD (Chemical Vapor Deposition) or ALD of a Lewis acid.

It is advantageous that the abovementioned processes (i) to (v) can be carried out in situ in a coating chamber for catalytic atomic layer deposition.

Stresses in the filling materials which have been introduced can be minimized by intervening heating steps, i.e. by a process sequence as follows: first filling step—heating—second filling step—heating—etc.

Furthermore, to avoid "corner devices" in the case of STI and inter-wordline fillings, it is advantageous to provide a perfect surface by prior thermal oxidisation of the walls of the trenches 106.

Structures with a high aspect ratio can be filled at a high deposition rate by using a homogenous deposition process in the form of the catalytic atomic layer deposition.

The deposition process can be carried out selectively by choosing the region in which a catalyst layer 201 is deposited. The highly uniform atomic layer deposition very largely avoids stress problems, which can lead to distortion of trench walls. The use of Lewis acids, such as for example dopants such as boron, aluminum, gallium, indium and titanium which have been introduced into the substrate, allows selective catalytic atomic layer deposition. In particular, it is advantageous that the use of a reaction accelerator, such as a Lewis acid, provides the possibility of linking the atomic layer deposition (ALD), which has a high deposition rate on account of the reaction accelerator, with selective patterning and/or filling of a substrate surface 105. It is in this way possible to provide a selective atomic layer deposition with a high filling rate.

The trenches which are provided in the substrate patterning region 102 of the substrate 101 typically have a width of between 50 nanometers and 500 nanometers and a depth of between 500 nanometers and 2.5 micrometers (μm). It is therefore possible to quickly fill the trenches by catalytic atomic layer deposition, with a thickness of several nanometers, preferably a thickness of the trench filling of up to 20 nanometers, being achieved by carrying out the step sequences of the atomic layer deposition once. It is in this way possible to quickly fill the trenches 106 which have been provided in the substrate patterning region 102 of the substrate 101 with a predetermined filling material.

Catalytic deposition of a reaction layer 202 in the trenches 106 that are to be filled in the substrate patterning region 102 is terminated when the deposited reaction layer 202 is of such a thickness that the catalytic layer 201 below it can no longer bring about a catalytic reaction with the reaction layer 202. When using atomic layer deposition, this situation typically arises when a layer thickness of a few nanometers up to approx. 20 nanometers (nm) has been reached. According to the invention, the process of catalytic deposition by means of atomic layer deposition is then repeated by another catalyst layer being introduced into the partly-filled trenches 106 in the substrate patterning region 102 and another reaction layer being deposited.

Figure 1A:
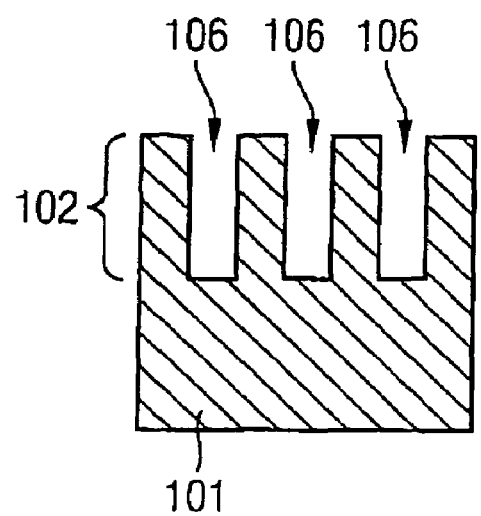
FIGS. 1(a), (b) and (c) show conventional coating processes for trenches formed in a substrate patterning region of a substrate.
Figure 1B:
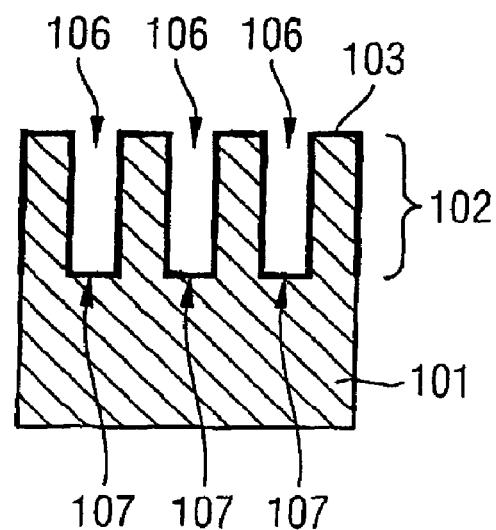
Figure 1C:
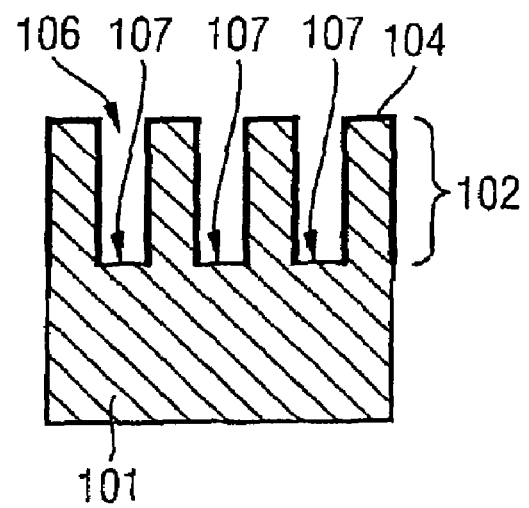

For details of the conventional layer structures shown in FIGS. 1(a), 1(b) and 1(c), reference is made to the introduction to the description.

Although the present invention has been described above on the basis of preferred exemplary embodiments, it is not restricted to these embodiments, but rather can be modified in numerous ways.

Also, the invention is not restricted to the possible applications which have been mentioned.

LIST OF DESIGNATIONS

In the figures, identical reference numerals denote identical or functionally equivalent components or steps.
101 Substrate
102 Substrate patterning region
103 Functional layer
104 Protective layer
105 Patterned surface
106 Trench
107 Base region
201 Catalyst layer
202 Reaction layer
203 Densified reaction layer
204 Process step repetition
205 Filling height

What is claimed is:

1. Coating process for patterned substrate surfaces, comprising the steps of:
 a) providing a substrate, which has a surface which is patterned in a substrate patterning region and has one or more trenches to be filled to a predetermined filling height;
 b) introducing a catalyst layer into the trenches that are to be filled in the substrate patterning region;
 c) depositing catalytically a reaction layer in the trenches that are to be filled in the substrate patterning region;
 d) densifying the catalytically deposited reaction layer in the trenches that are to be filled, in order to obtain a densified reaction layer; and
 e) repeating steps b) to d) until the predetermined filling height of the trenches to be filled has been reached, wherein step c) of catalytically depositing the reaction layer in the trenches that are to be filled in the substrate patterning region comprises the substeps of:
  (i) passing a gaseous precursor over the surface of the trenches which are to be filled and have been coated with the catalyst layer, in such a manner that the precursor reacts as a result of the catalyst layer on the surface, leading to coating of constituents of the precursor;
  (ii) passing a gaseous coating agent over the surface of the trenches which are to be filled and have coated with the catalyst layer, in such a manner that a reaction layer is catalytically deposited; and
  (iii) repeating steps (i) and (ii) until the catalytic reactions effected by steps (i) and (ii) have ended.

2. Process according to claim 1, wherein the step of introducing the catalyst layer into the trenches that are to be filled in the substrate patterning region is carried out by means of a physical vapor deposition operation.

3. Process according to claim 1, wherein carrying out the sequence of steps (i) and (ii) once catalytically deposits the reaction layer with a thickness of several nanometers, preferably with a thickness of up to 20 nanometers.

4. Process according to claim 1, wherein the sequence of steps comprising steps (i) and (ii) is carried out cyclically, the number of cycles preferably being in a range between 0 and 200.

5. Process according to claim 1, wherein the substrate is formed from a silicon material.

6. Process according to claim 1, wherein the substrate is formed from an insulation material.

7. Process according to claim 1, wherein the substrate has a substrate patterning region with a high aspect ratio.

8. Process according to claim 1 wherein the catalytic deposition of the reaction layer in the trenches that are to be filled in the substrate patterning region comprises deposition of metal-semiconductor oxide materials, preferably of silicon oxide materials, and/or deposition of metal-semiconductor nitride materials, preferably of silicon nitride materials.

9. Process according to claim 1 wherein the catalytic deposition of the reaction layer in the trenches that are to be filled in the substrate patterning region comprises deposition of a silicon dioxide thin film.

10. Process according to claim 1 wherein the catalytic deposition of the reaction layer in the trenches that are to be filled in the substrate patterning region is carried out as an atomic layer deposition operation.

11. Process according to claim 1, wherein the catalyst layer is provided as a Lewis acid.

12. Process according to claim 1 wherein the catalyst layer is introduced into the substrate in the region of the trenches that are to be filled in the substrate patterning region at a predetermined angle with respect to the surface normal to the substrate surface.

13. Process according to claim 1, wherein the coating process for patterned substrate surface is carried out as a low-pressure coating process by means of a low-pressure reactor at an internal pressure in a pressure range from preferably a few mTorr to a few Torr.

14. Process according to claim 13, wherein the temperature of the substrate during the coating process is set in a range from 50° C. to 700° C.

15. Process according to claim 1, wherein the reaction layer is formed as a silicon dioxide layer ($SiO_2$).

16. Process according to claim 1, wherein the introduction of the catalyst layer into the trenches that are to be filled in the substrate patterning region is effected by selective deposition.

17. Process according to claim 16, wherein the selective deposition of the reaction layer in the trenches that are to be filled in the substrate patterning region is carried out by means of chemical vapor deposition, e.g. CVD or ALD.

18. Process according to claim 1, wherein the catalyst layer is deposited only on base regions of the trenches that are to be filled in the substrate patterning region.

19. Process according to claim 1, wherein the catalytic deposition of the reaction layer in the trenches that are to be filled in the substrate patterning region is carried out by means of an atomic layer deposition process.

20. Process according to claim 1, wherein the catalytic deposition of the reaction layer in the trenches that are to be filled in the substrate patterning region is carried out by means of an anisotropic deposition process.

21. Process according to claim 1, wherein the densification of the catalytically deposited reaction layer in the filled trenches is carried out thermally.

22. Process according to claim 21, wherein the densification of the catalytically deposited reaction layer in the filled trenches is carried out thermally in a temperature range between 500° C. and 1300° C.

23. Process according to claim 21, wherein the densification of the catalytically deposited reaction layer in the filled trenches is carried out in a surrounding atmosphere which consists of nitrogen and/or ammonia and/or noble gases and/or oxygen-containing gases.

* * * * *